(12) United States Patent
Lee (10) Patent No.: US 11,468,119 B2
(45) Date of Patent: Oct. 11, 2022

(54) MEMORY SYSTEM AND METHOD OF OPERATING THE SAME

(71) Applicant: SK hynix Inc., Gyeonggi-do (KR)

(72) Inventor: Dong Sop Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 29 days.

(21) Appl. No.: 16/930,898

(22) Filed: Jul. 16, 2020

(65) Prior Publication Data

US 2020/0349196 A1 Nov. 5, 2020

Related U.S. Application Data

(63) Continuation of application No. 16/031,672, filed on Jul. 10, 2018, now Pat. No. 10,733,232.

(30) Foreign Application Priority Data

Dec. 20, 2017 (KR) .................. 10-2017-0176594

(51) Int. Cl.
| | | |
|---|---|---|
| *G06F 16/901* | (2019.01) | |
| *G06F 12/1018* | (2016.01) | |
| *G11C 8/04* | (2006.01) | |
| *G11C 7/22* | (2006.01) | |
| *G11C 7/10* | (2006.01) | |
| *G11C 16/30* | (2006.01) | |
| *G11C 16/08* | (2006.01) | |

(52) U.S. Cl.
CPC ...... *G06F 16/9014* (2019.01); *G06F 12/1018* (2013.01); *G11C 7/1006* (2013.01); *G11C 7/22* (2013.01); *G11C 8/04* (2013.01); *G11C 16/08* (2013.01); *G11C 16/30* (2013.01)

(58) Field of Classification Search
CPC ............ G06F 16/9014; G06F 12/1018; G11C 7/1006; G11C 7/22; G11C 8/04; G11C 16/08; G11C 16/30
See application file for complete search history.

(56) References Cited

U.S. PATENT DOCUMENTS

2018/0293174 A1* 10/2018 Song .................. G06F 12/1009

OTHER PUBLICATIONS

Lensing, Paul Hermann, Toni Cortes, and André Brinkmann. "Direct lookup and hash-based metadata placement for local file systems." Proceedings of the 6th International Systems and Storage Conference. 2013. (Year: 2013).*

* cited by examiner

*Primary Examiner* — Kalpit Parikh
(74) *Attorney, Agent, or Firm* — IP & T Group LLP (57) ABSTRACT

A memory system includes a memory device configured to store data, and a memory controller configured to perform communication between a host and the memory device and to control the memory device such that, during an operation of programming sequential data, a hash value is generated from logical block addresses of a memory area, to which the sequential data is to be written, and the hash value is stored and such that, during an operation of reading the sequential data, the sequential data is read from the memory area based on the hash value.

20 Claims, 10 Drawing Sheets

MEMORY SYSTEM AND METHOD OF OPERATING THE SAME

CROSS-REFERENCE TO RELATED APPLICATION

This application is a continuation of U.S. patent application Ser. No. 16/031,672 filed on Jul. 10, 2018, which claims benefits of priority of Korean Patent Application No. 10-2017-0176594 filed on Dec. 20, 2017. The disclosure of each of the foregoing application is incorporated herein by reference in its entirety.

BACKGROUND

1. Field of Invention

Various embodiments of the present disclosure generally relate to a memory system and a method of operating the memory system and, more particularly, to a memory system and a method of operating the memory system, which can shorten the time required for a read operation.

2. Description of Related Art

A memory system may include a storage device and a memory controller.

The storage device may include a plurality of memory devices, which may store data and/or output stored data. For example, the memory devices may be implemented as volatile memory devices in which data stored therein is lost when the supply of power is interrupted or as nonvolatile memory devices in which data stored therein is retained even when the supply of power is interrupted.

The memory controller may control data communication between a host and the storage device.

The host can communicate with the memory devices through the memory controller using an interface protocol, such as a Peripheral Component Interconnect express (PCIe), an Advanced Technology Attachment (ATA), a Serial ATA (SATA), a Parallel ATA (PATA) or a Serial Attached SCSI (SAS). Interface protocols between the host and the memory system are not limited to the above-described examples, and may include various interfaces, such as a Universal Serial Bus (USB), a Multi-Media Card (MMC), an Enhanced Small Disk Interface (ESDI), or an Integrated Drive Electronics (IDE).

SUMMARY

Various embodiments of the present disclosure are directed to a memory system and a method of operating the memory system. The memory system and the operating method thereof may generate hash values from address mapping information during a program operation. The hash values may then be used during a read operation by the memory system for shortening the time required for the read operation.

An aspect of the present invention is directed to a memory system. The memory system may include a memory device configured to store data, and a memory controller configured to perform communication between a host and the memory device and to control the memory device such that, during an operation of programming sequential data, a hash value is generated from logical block addresses of a memory area, to which the sequential data is to be written, and the hash value is stored and such that, during an operation of reading the sequential data, the sequential data is read from the memory area based on the hash value.

Another aspect of the present invention is directed to a method of operating the memory system. The method may include generating a hash value by applying an algorithm using a hash function to logical block addresses of memory areas to which data is to be written, mapping an entry of the memory areas to which the data is to be written to the hash value, storing the hash value and the entry mapped thereto in a hash table, and storing information including the entry of the memory areas in an internal memory, programming the data to the memory areas, during a data read operation, simultaneously searching the internal memory and the hash table for an entry matching between the internal memory and the hash table, and when there is the entry matching between the internal memory and the hash table, performing a read operation on the memory areas based on the hash value mapped to the entry.

Another aspect of the present invention is directed to a memory system comprising: a memory device; a hash unit suitable for generating, in response to a write request for sequential data, a hash value for a logical address of the sequential data, and storing the hash value in a hash table included therein, the hash table including a physical address corresponding to the hash value; and a control unit suitable for: searching, in response to a read request for the sequential data, the hash table for the hash value corresponding to the logical address of the sequential data; and controlling the memory device to perform a read operation according to the physical address corresponding to the searched hash value.

DETAILED DESCRIPTION

The present invention, including its various advantages and features will be described with reference to certain exemplary embodiments. It is noted, however, that he the present invention is not limited to the described embodiments but may be embodied in other embodiments and variations thereof. Rather, the described embodiments are provided so that the disclosure of the present invention will be thorough and complete and will fully convey the technical spirit of the invention to those skilled in the art to which the present invention pertains.

It is also noted that in this specification, "connected/coupled" refers to one component not only directly coupling another component but also indirectly coupling another component through an intermediate component.

It is further noted that in the specification, the terms "comprises" and "includes" and variations thereof are used interchangeably. Hence, when an element is referred to as "comprising" or "including" a component, it does not preclude the presence of another component but may further include other components.

In the following description, numerous specific details are set forth in order to provide a thorough understanding of the present invention. The present invention may be practiced without some or all these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Figure 1:
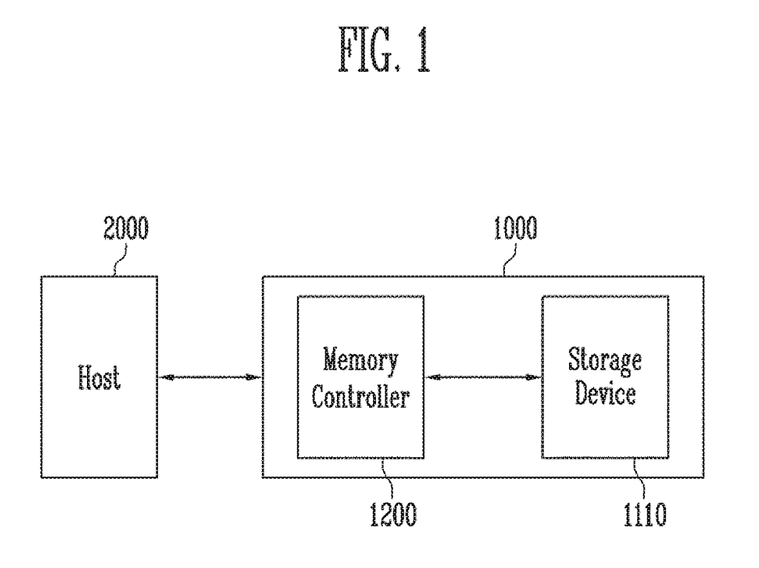
FIG. 1 is a diagram illustrating a memory system in accordance with an embodiment of the present disclosure.

FIG. 1 is a diagram illustrating a memory system 1000 operatively coupled to a host 2000, in accordance with an embodiment of the present disclosure.

Referring to FIG. 1, the memory system 1000 may include a storage device 1110 which stores data, and a memory controller 1200 which performs communication between the storage device 1110 and the host 2000.

The storage device 1110 may be implemented as a volatile memory device in which data stored therein is lost when the supply of power is interrupted or a nonvolatile memory device in which data stored therein is retained even when the supply of power is interrupted.

The memory controller 1200 may control the storage device 1110 so that a program operation, a read operation or an erase operation is performed in response to a request received from the host 2000.

The host 2000 may communicate with the memory system 1000 using at least one of various communication methods such as a Universal Serial Bus (USB), a Serial AT Attachment (SATA), a Serial Attached SCSI (SAS), a High Speed Interchip (HSIC), a Small Computer System Interface (SCSI), a Peripheral Component Interconnection (PCI), a PCI express (PCIe), a NonVolatile Memory express (NVMe), a Universal Flash Storage (UFS), a Secure Digital (SD), a MultiMedia Card (MMC), embedded MMC (eMMC), a Dual In-line Memory Module (DIMM), Registered DIMM (RDIMM), and a Load Reduced DIMM (LRDIMM) communication methods.

The above-described memory system 1000 will be described in detail below.

Figure 2:
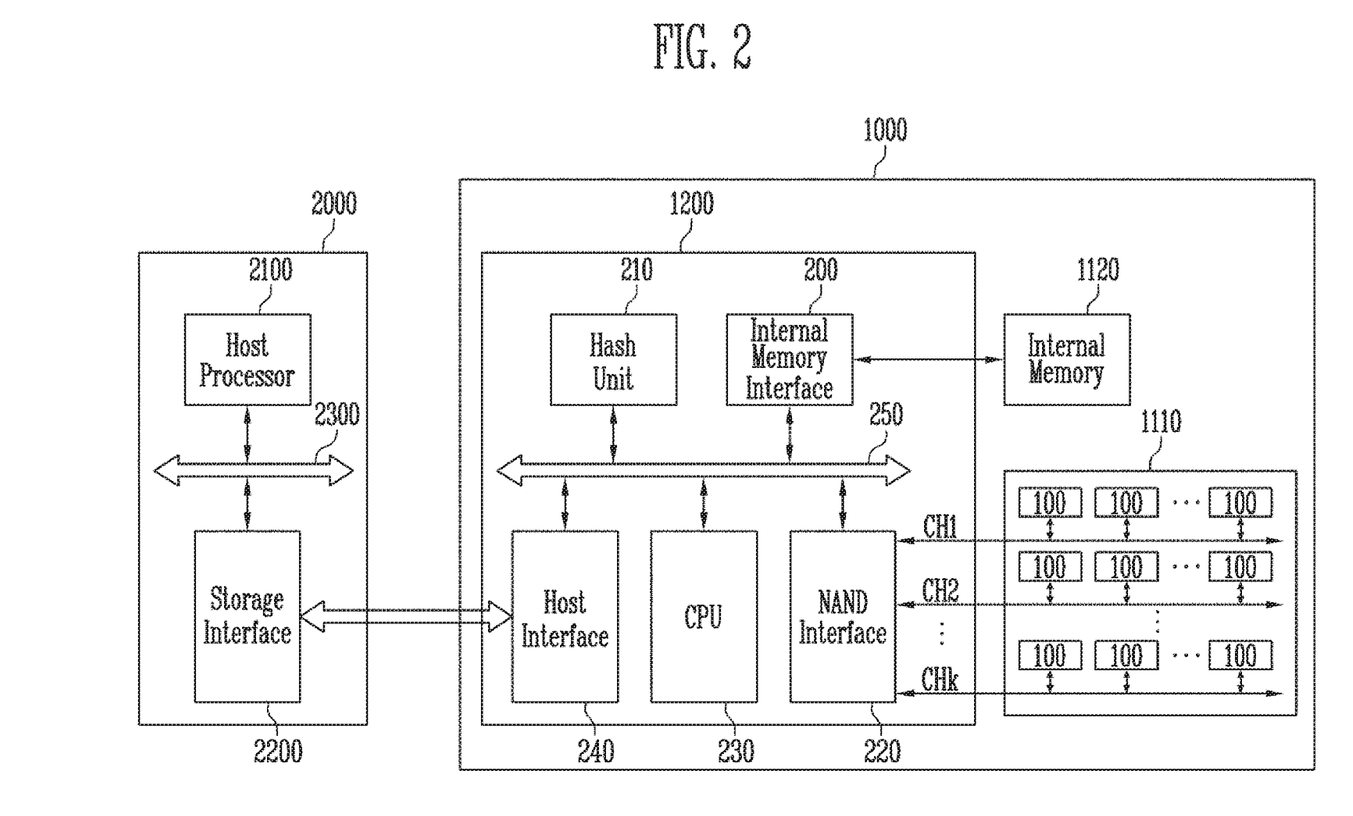
FIG. 2 is a diagram illustrating an exemplary configuration of the memory system shown in FIG. 1.

FIG. 2 is a detailed diagram illustrating an exemplary configuration of the memory system 1000 of FIG. 1.

Referring to FIG. 2, the memory system 1000 may include a storage device 1110 which stores data, an internal memory 1120 which stores data used for the internal operation of the memory system 1000, and a memory controller 1200 which controls the storage device 1110 and the internal memory 1120 in response to a request received from the host 2000.

The storage device 1110 may include a plurality of memory devices 100. For example, each of the memory devices 100 may be implemented as a volatile memory device in which data stored therein is lost when the supply of power is interrupted or a nonvolatile memory device in which data stored therein is retained even when the supply of power is interrupted. For the remaining description of the embodiment of FIG. 2, it is assumed that the memory devices 100 are implemented as nonvolatile memory devices by way of example. For example, the nonvolatile memory device 100 may be a flash memory device, especially, a NAND flash memory device.

The memory devices 100 may communicate with the memory controller 1200 through a plurality of channels CH1 to CHk. For example, a plurality of memory devices 100 may be coupled to each of the first to k-th channels CH1 to CHk. Memory devices 100 coupled to different channels may be operated independently of each other, i.e., may be operated in parallel.

The internal memory 1120 may be used as a working memory, a cache memory, or a buffer memory of the memory controller 1200. The internal memory 1120 may store codes and commands that are executed by the memory controller 1200. Further, the internal memory 1120 may store data that is processed by the memory controller 1200. Further, the internal memory 1120 may store a logical-physical address mapping table, which configures mapping relationships between logical addresses and physical addresses. For example, the internal memory 1120 may be configured using one or more of a Random-Access Memory (RAM), a Dynamic RAM (DRAM), a Static RAM (SRAM), a cache, and a Tightly Coupled Memory (TCM).

The memory controller 1200 may include an internal memory interface 200, a hash unit 210, a NAND interface 220, a Central Processing Unit (CPU) 230, and a host interface 240, operatively coupled via an internal bus 250.

The internal memory interface 200 may communicate with the internal memory 1120 under the control of the CPU 230.

During a program operation of the memory system 1000, the hash unit 210 may generate a hash value by applying a hash function to address mapping information related to some data, and may store the hash value.

The NAND interface 220 may communicate with the storage device 1110 under the control of the CPU 230. The NAND interface 220 may transmit/receive commands, addresses, and data to/from the memory devices 100 through channels CH1, CH2, . . . , CHk.

The CPU 230 may perform various operations for controlling the storage device 1110 or may generate commands and addresses. For example, the CPU 230 may determine whether a program operation requested by the host 2000 is a sequential program operation or a non-sequential program operation. For example, during a program operation, the CPU 230 may determine whether data received from the host 2000 is sequential data or non-sequential data. Sequential data may be received from the host 2000 during a sequential program operation, and non-sequential data may be received from the host 2000 during a non-sequential program operation. Here, the sequential data may be either consecutive data which is received from the host 2000 and which has a size greater than a reference storage capacity of the memory device 100, or data received as a single large-sized file. The sequential data may be consecutively written to a plurality of memory blocks due to the large size thereof. For example, the sequential data may be large-sized data, such as video data. The reference storage capacity may be set differently depending on the memory system 100. Non-sequential data may be data which has a size less than the reference storage capacity or data which is received from the host 2000 during a random program operation.

The host interface 240 may exchange commands, addresses, and data between the memory controller 1200 and the host 2000. For example, the host interface 240 may receive commands, addresses, data, or the like from the host 2000, and may transmit read data or the like to the host 2000.

The above-described internal memory interface 200, hash unit 210, NAND interface 220, CPU 230, and host interface 240 may communicate with each other through the bus 250.

The host 2000 may include a host processor 2100 and a storage interface 2200. The host processor 2100 and the storage interface 2200 may communicate with each other through a bus 2300.

The host processor 2100 may generate various requests. In addition, the host processor 2100 may control the operation of transmitting various operation requests such as an erase request, firmware, etc. to the memory system 1000. For example, the host processor 2100 may generate a program request for controlling a program operation of the memory system 1000 or a read request for controlling a read operation of the memory system 1000. The program request may include a program external command and a logical address which are to be transmitted to the memory system 1000. For example, the read request may include a read external command and a logical address which are to be transmitted to the memory system 1000.

The storage interface 2200 may communicate with the memory system 1000 using an interface protocol such as a Peripheral Component Interconnect express (PCIe), an Advanced Technology Attachment (ATA), a serial ATA (SATA), a parallel ATA (PATA), a Serial Attached SCSI (SAS) or a Nonvolatile Memory express (NVMe) interface protocol. The storage interface 2200 is not limited to the above-described examples, and may include various interfaces, such as a Universal Serial Bus (USB), a Multi-Media Card (MMC), an Enhanced Small Disk Interface (ESDI), or an Integrated Drive Electronics (IDE) interface.

Figure 3:
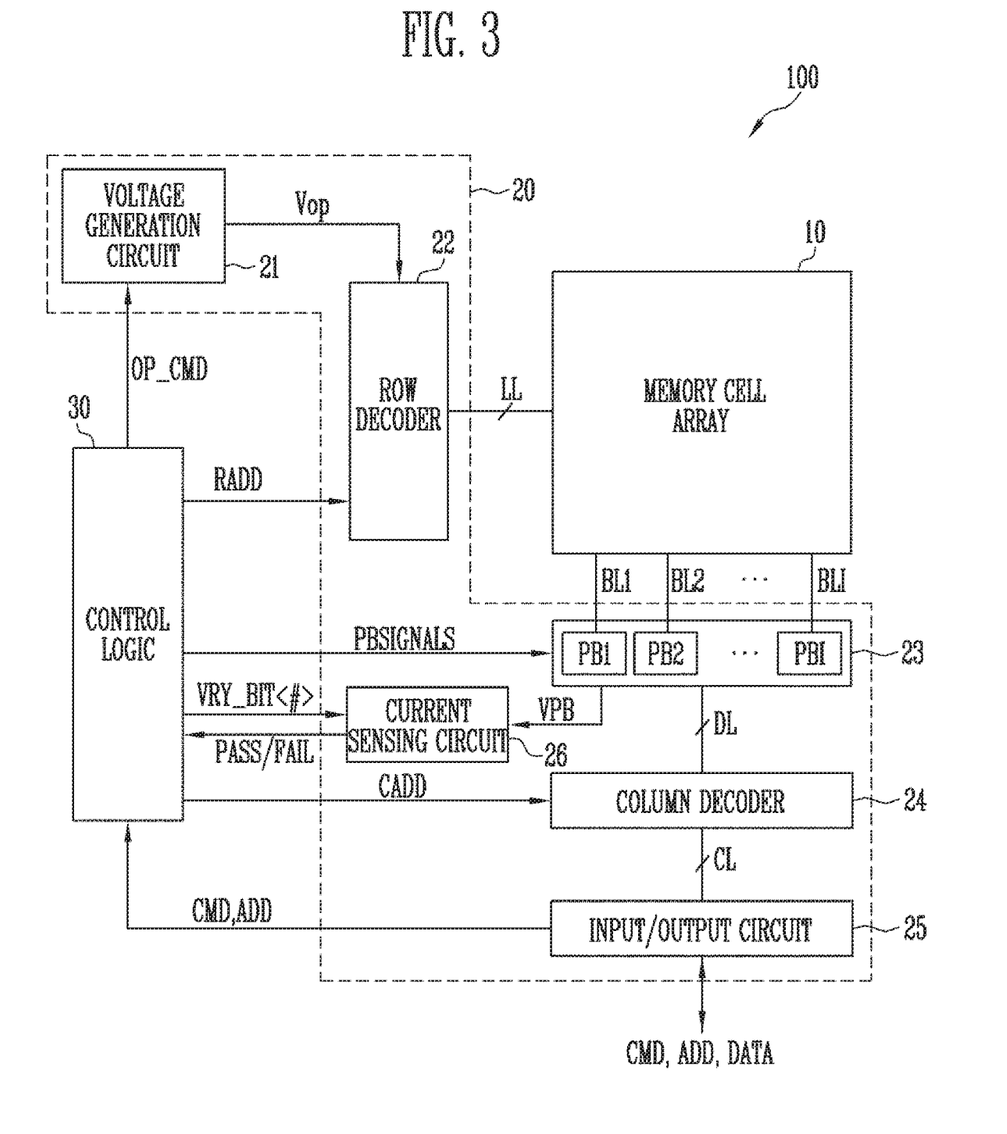
FIG. 3 is a diagram illustrating in detail a memory device of FIG. 2.

FIG. 3 is a diagram illustrating in detail an exemplary configuration of the memory device of FIG. 2.

Referring to FIG. 3, the memory device 100 may include a memory cell array 10 in which data is stored. The memory device 100 may include peripheral circuits 20 configured to perform a program operation for storing data in the memory cell array 10, a read operation for outputting the stored data, and an erase operation for erasing the stored data. The memory device 100 may include a control logic 30 which controls the peripheral circuits 20 under the control of the memory controller (e.g., 1200 of FIG. 2).

The memory cell array 10 may include a plurality of memory blocks. In the memory blocks, user data and various types of information required for the operation of the memory device 100 may be stored. The memory blocks may each be implemented in a two-dimensional (2D) or three-dimensional (3D) structure.

The peripheral circuits 20 may perform program, read, and erase operations under the control of the control logic 30. For example, the peripheral circuits 20 may include a voltage generation circuit 21, a row decoder 22, a page buffer group 23, a column decoder 24, an input/output circuit 25, and a current sensing circuit 26.

The voltage generation circuit 21 may generate various operating voltages Vop used for program, read, and erase operations in response to an operation signal OP_CMD. For example, the voltage generation circuit 21 may generate a program voltage, a verify voltage, a pass voltage, a compensation program voltage, a read voltage, an erase voltage, a turn-on voltage, etc. under the control of the control logic 30.

The row decoder 22 may transfer operating voltages Vop to local lines LL coupled to a memory block selected from among the memory blocks of the memory cell array 10 in response to a row address RADD. The local lines LL may include local word lines, local drain select lines, and local source select lines. In addition, the local lines LL may include various lines, such as source lines, coupled to the memory blocks.

The page buffer group 23 may be coupled to bit lines BL1 to BLI coupled to the memory blocks of the memory cell array 10. The page buffer group 23 may include a plurality of page buffers PB1 to PBI coupled to the bit lines BL1 to BLI. The page buffers PB1 to PBI may be operated in response to page buffer control signals PBSIGNALS. For example, the page buffers PB1 to PBI may temporarily store data received through the bit lines BL1 to BLI or may sense voltages or currents of the bit lines BL1 to BLI during a read or verify operation.

The column decoder 24 may transfer data between the input/output circuit 25 and the page buffer group 23 in response to a column address CADD. For example, the column decoder 24 may exchange data with the page buffers PB through data lines DL or may exchange data with the input/output circuit 25 through column lines CL.

The input/output circuit 25 may transmit a command CMD and an address ADD, received from a memory controller (e.g., 1200 of FIG. 2), to the control logic 30, or may exchange data with the column decoder 24.

During the read or verify operation, the current sensing circuit 26 may generate a reference current in response to an enable bit VRY_BIT<#>, and may compare a sensing voltage VPB, received from the page buffer group 23, with a reference voltage, generated by the reference current, and then output a pass signal PASS or a fail signal FAIL.

The control logic 30 may output the operation signal OP_CMD, the row address RADD, the page buffer control signals PBSIGNALS, and the enable bit VRY_BIT<#> in response to the command CMD and the address ADD, and may then control the peripheral circuits 20. Also, the control logic 30 may determine whether a verify operation has passed or failed in response to the pass or fail signal PASS or FAIL.

Figure 4:
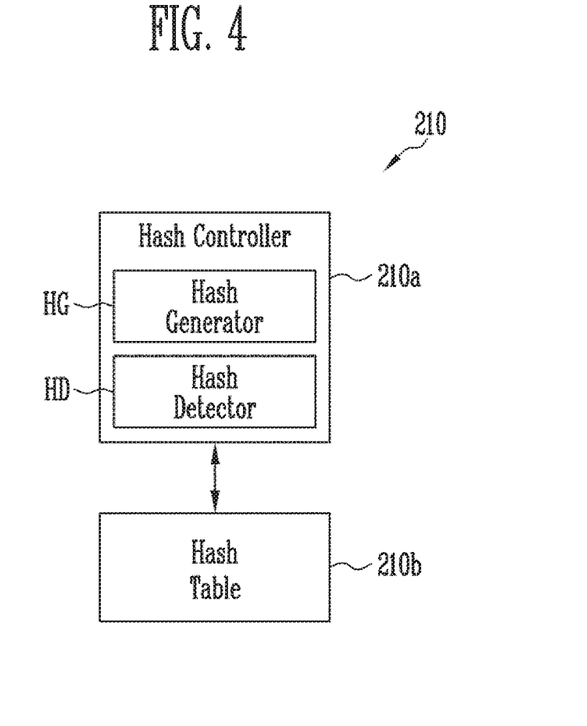
FIG. 4 is a diagram illustrating an exemplary configuration of a hash unit shown in FIG. 2.

FIG. 4 is a diagram illustrating an exemplary configuration of the hash unit 210 of FIG. 2.

Referring to FIG. 4, the hash unit 210 may include a hash controller 210a and a hash table 210b.

The hash controller 210a may generate a hash value for logical addresses corresponding to sequential data under the control of the CPU 230 during a program operation, and may compare the hash value with provided logical addresses during a read operation. For example, the hash controller 210a may include a hash generator HG for generating hash values and a hash detector HD for determining whether any hash value corresponding to logical addresses, which are provided during a read operation, is present by comparing each hash value with the logical addresses. For example, the hash generator HG may generate a hash value for logical addresses corresponding to sequential data during a program operation, and the generated hash value may be stored in the hash table 210b, with the hash value being mapped to a start logical address (i.e., an entry logical address) of the plurality of logical address corresponding to a sequential data. The hash generator HG may generate a hash value for logical addresses using a hash function. The hash generator HG may transmit physical address information corresponding to the generated hash value to the CPU 230.

During a read operation, the hash detector HD may determine whether an entry logical address corresponding to a logical address received from the host 2000 is present and transmit the result of determination to the CPU 230.

The hash table 210b may store hash values generated by the hash controller 210a and respective entry logical addresses mapped to the generated hash values.

Figure 5:
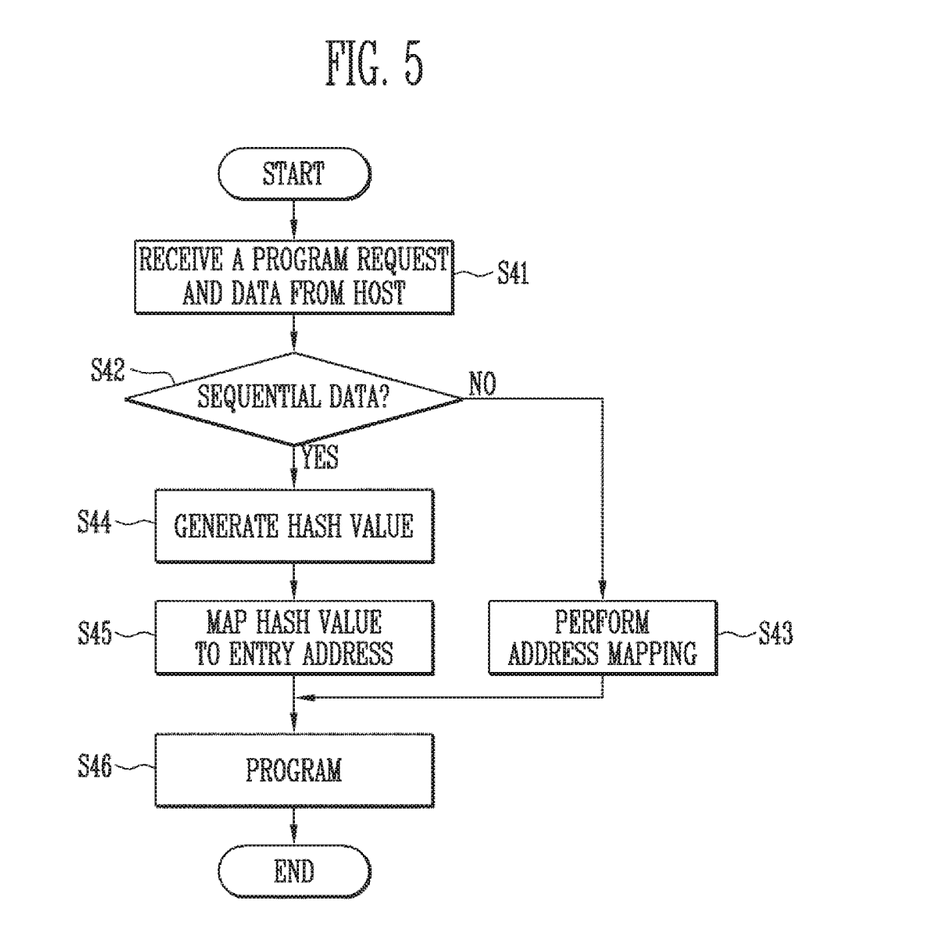
FIG. 5 is a flowchart illustrating a program operation in accordance with an embodiment of the present disclosure.

FIG. 5 is a flowchart illustrating a program operation in accordance with an embodiment of the present disclosure.

Referring to FIG. 5, hash values may be generated during a program operation of a memory system 1000. At step S41, a program request and data are received from a host 2000. As a result, the memory controller 1200 may operate in a program mode. Then, at step S42, the CPU 230 of the memory controller 1200 may determine whether the data received from the host 2000 is sequential data. For example, sequential data may be large-sized data which form a single file. A criterion for identifying whether the received data is large size may be set differently depending on the memory system 1000.

If it is determined that the received data is not sequential data ("No" at step S42), the CPU 230 may then address mapping by mapping a physical address corresponding to a memory block in which the received data is to be stored to a logical address at step S43. For example, when random data is received, random addresses do not need to be sequentially written to the memory block, and thus the CPU 230 may map the logical addresses to the physical addresses of the memory block to which the random data is to be written. Information about the addresses mapped at step S43 may be stored in the internal memory 1120.

When address mapping is terminated at step S43, the CPU 230 may control a memory device 100 so that a program operation is performed on the memory block corresponding to the mapped physical address at step S46.

If it is determined that the received data is sequential data ("Yes" at step S42), the CPU 230 may control the hash controller 210a so that a hash value is generated from logical addresses corresponding to memory blocks in which the received sequential data is to be stored at step S44. For example, the hash controller 210a may generate the hash value corresponding to the logical addresses based on a hash algorithm to which a hash function is applied. Then, the CPU 230 may store the generated hash value and the corresponding address as a mapping entry at step S45. The hash value may be stored in the hash table 210b. That is, mapping entries of memory areas in which sequential data is stored may be stored as hash values. The above-described steps S44 and S45 will be described in detail later with reference to FIGS. 6 to 8.

The CPU 230 may control the memory device 100 so that data is programmed to memory blocks corresponding to the hash value at step S46.

Figure 6:
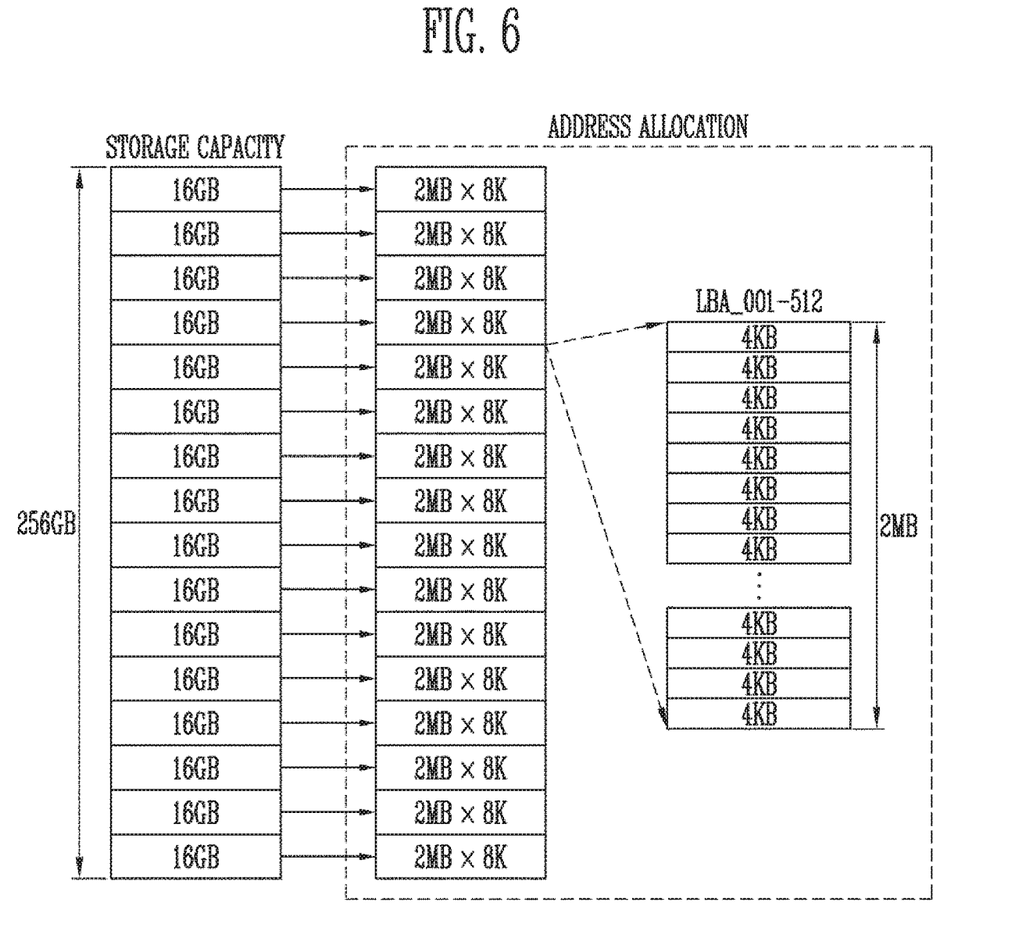
FIG. 6 is a diagram illustrating an address allocation method in accordance with an embodiment of the present disclosure.

FIG. 6 is a diagram illustrating an address allocation method in accordance with an embodiment of the present disclosure.

Referring to FIG. 6, assuming that the total storage capacity of the memory device 100 or the storage device 1110 is 256 gigabytes (hereinafter referred to as "256 GB"), a 256 GB memory area may be divided into 16 memory areas, each having a capacity of 16 gigabytes (hereinafter referred to as "16 GB"), and an entry may be allocated to each memory area. That is, one entry may be allocated to a 16 GB memory area. Here, the term "entry" means an address allocated to each memory area.

Each of 16 16 GB entries may be divided into 8,000 (hereinafter referred to as "8K") memory areas, each having a capacity of 2 megabytes (hereinafter referred to as "2 MB"). For example, 8K entries may be allocated to a 16 GB memory area.

Each of 8K 2 MB entries may be divided into 512 memory blocks, each having a capacity of 4 kilobytes (hereinafter referred to as "4 KB"). For example, 512 logical block addresses (LBA) may be allocated to each 2 MB memory area. For example, first to 512-th logical block addresses LBA_001 to LBA_512 may be allocated to a 2 MB memory area. That is, one logical block address LBA may be allocated to one memory block of 4 KB.

During a program operation, data received from the host 2000 may be written to memory blocks to which the first to 512-th logical block addresses LBA_001 to LBA_512 are allocated. Therefore, during the program operation, the memory controller 1200 may map the physical addresses of memory blocks to logical addresses including logical block addresses LBA, and may store information about the mapping in the mapping table of the internal memory 1120 of FIG. 2.

During a read operation, the memory controller 1200 may scan the mapping table of the internal memory 1120 and then read data from the memory blocks that correspond to the physical addresses mapped to the logical addresses. Further, during the read operation, the memory controller 1200 may scan the hash table 210b of FIG. 4. If there is a hash value corresponding to an entry logical address, the memory controller 1200 may omit the operation of scanning all logical block addresses LBA corresponding to the entry logical address, and may directly read data from memory blocks corresponding to the hash value based on the entry logical address.

A method of generating hash values will be described in detail below.

Figure 7:
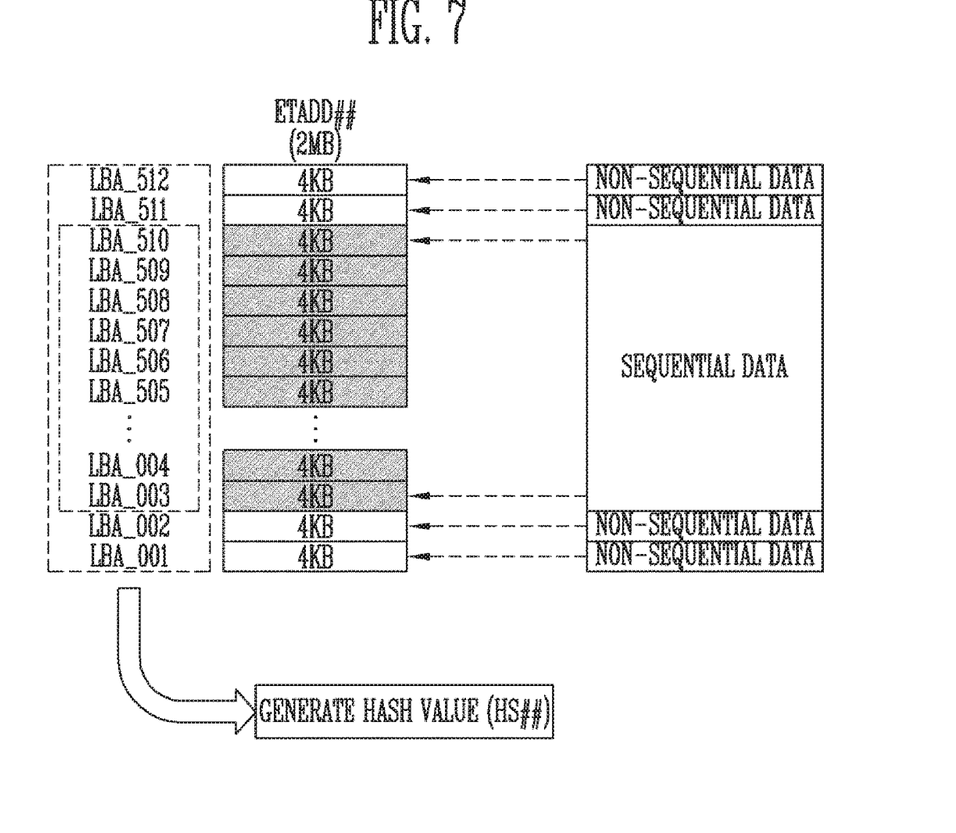
FIG. 7 is a diagram illustrating a hash value generation method in accordance with an embodiment of the present disclosure.
Figure 8:
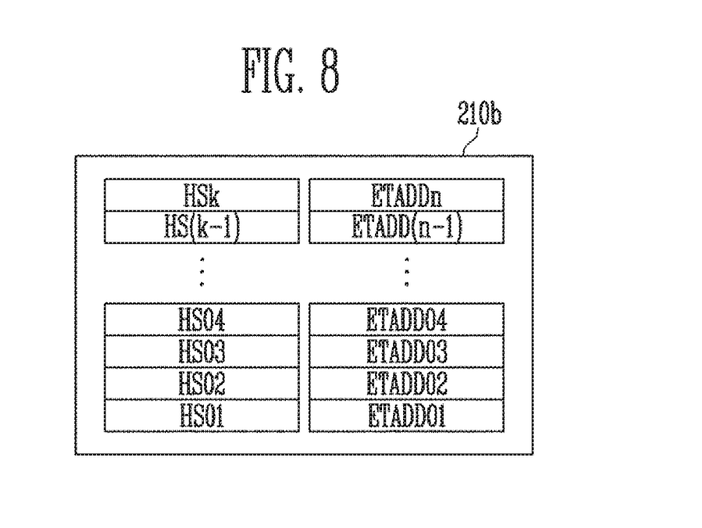
FIG. 8 is a diagram illustrating information stored in a hash table in accordance with an embodiment of the present disclosure.

FIG. 7 is a diagram illustrating a hash value generation method in accordance with an embodiment of the present disclosure, and FIG. 8 is a diagram illustrating information stored in a hash table 210b in accordance with an embodiment of the present disclosure.

In FIG. 7, a program operation in which sequential data is received from the host 2000 is described by way of example.

When addresses corresponding to a memory area to which sequential data is to be written are third to 510-th logical block addresses LBA_003 to LBA_510, a hash value HS ## may be generated from logical block addresses LBA_001 to LBA_512 for the entry of a 2 MB memory area including the third to 510-th logical block addresses LBA_003 to LBA_510. For example, as illustrated in FIG. 6, respective entries ETADD ## may be designated for 2 MB memory areas, and a single hash value HS ## may be generated from logical block addresses LBA_001 to LBA_512 included in the memory area to which sequential data is to be written, among the memory areas. The hash value HS ## may be composed of a plurality of bits, and physical addresses corresponding to the hash value HS ## may be designated. For example, physical addresses corresponding to the third to 510-th logical block addresses LBA_003 to LBA_510 may be designated depending on the hash value HS ##. Physical addresses may be designated by the hash controller 210a of FIG. 4. A case where sequential data is written to one 2 MB memory area will be described by way of example.

Memory blocks to which the sequential data is to be written may be specified at the third to 510-th logical block addresses LBA_003 to LBA_510. Here, memory blocks to which non-sequential data is to be written may be specified at remaining logical block addresses (that is, first, second, 511-th, and 512-th logical block addresses LBA_001, 002, 511, and 512) included in the 2 MB memory area of the entry ETADD ##. The non-sequential data may be random data. During a program operation, the hash controller 210a may specify non-sequential data at the first, second, 511-th, and 512-th logical block addresses LBA_001, 002, 511, and 512, and the hash value HS ## is not generated during the operation of programming the non-sequential data.

If sequential data is received, the hash controller 210a may specify the sequential data at the third to 510-th logical block addresses LBA_003 to 510, and may generate a hash value HS ## for the 2 MB memory area including the third to 510-th logical block addresses LBA_003 to 510. The generated hash value HS ## may be stored in the hash table 210b so that it is mapped to the entry ETADD ## of the 2 MB memory area including the third to 510-th logical block addresses LBA_003 to 510.

The hash table 210b will be described in detail below with reference to FIG. 8.

In the hash table 210b, the entries ETADD01 to ETADDn of 2 MB memory areas to which sequential data is to be written and hash values HS01 to HSk corresponding to the entries ETADD01 to ETADDn may be stored. Although, in FIG. 8, reference numerals ETADD01 to ETADDn indicative of entries and reference numerals HS01 to HSk indicative of hash values are sequentially illustrated, the entries and hash values may not be actually sequential. For example, the entry of a first memory area may be defined as a first entry ETADD01, and the entry of a fifth memory area may be defined as a second entry ETADD02. In accordance with an embodiment of the present invention, the hash values may be mapped to respective entries in a one-to-one correspondence and sequential data may be written to memory areas of the entries corresponding to the hash values, as illustrated in FIG. 8.

During the operation of reading sequential data, if the logical address of a selected memory area is a second entry ETADD02, the operation of searching for logical block addresses may be omitted by means of a second hash value HS02 mapped to the second entry ETADD02. That is, data may be sequentially read from memory blocks according to the physical addresses corresponding to the second hash value HS02. Therefore, the time required for the operation of reading sequential data may be shortened.

For example, when the operation of reading sequential data is performed, the CPU 230 may search the internal memory 1120 of FIG. 2 for the entries of memory areas while searching the hash table for a hash value HS ## corresponding to a selected entry ETADD ##. Here, the CPU 230 may search for the entry ETADD ## mapped to the hash value HS ## rather than searching for the hash value HS ## in the hash table 210b. When the entry ETADD ## of the selected memory area is found in the hash table 210b, the hash controller 210a of FIG. 4 may transmit physical address information corresponding to the hash value HS ## mapped to the found entry ETADD ## to the CPU 230. The CPU 230 may control the memory device 1000 so that a read operation is performed on memory blocks corresponding to physical addresses in response to the physical address information received from the hash controller 210a. That is, when an entry is found in the hash table 210b, a hash value HS ## mapped to the found entry may be selected.

When an operation of reading non-sequential data is performed, the CPU 230 of FIG. 2 may detect the logical block addresses of a memory area to which non-sequential data is written by searching only the internal memory 1120 of FIG. 2.

Figure 9:
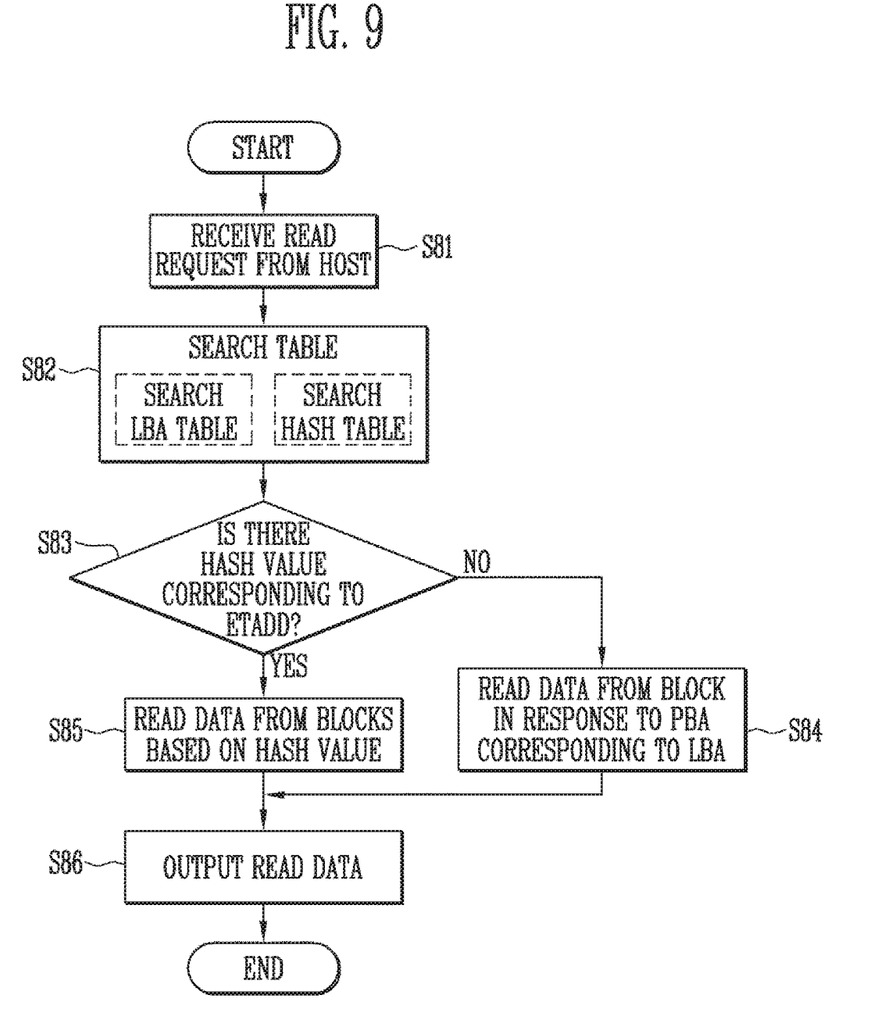
FIG. 9 is a flowchart illustrating a read operation in accordance with an embodiment of the present disclosure.

FIG. 9 is a flowchart illustrating a read operation in accordance with an embodiment of the present disclosure.

Referring to FIG. 9, when a read request is received from the host 2000 at step S81, the CPU 230 of the memory controller 1200 may search the internal memory 1120 for a physical address corresponding to a logical address at step S82. For example, the logical address may be received together with the read request from the host 2000. The CPU 230 may determine whether data to be read in response to the read request is sequential data or non-sequential data.

Further, at step S82, the CPU 230 may search the hash table 210b while searching a logical block address (LBA) table in the internal memory 1120. In detail, the CPU 230 may search the mapping table of the internal memory 1120 for a physical address based on the logical address received from the host 2000 while searching the hash table 210b of FIG. 8 for a hash value also based on the logical address received from the host 200.

The CPU 230 may determine whether there is a hash value corresponding to the logical address received from the host 200. If there is no hash value corresponding to the logical address received from the host 200 ("No" at step S83), the CPU 230 may control the memory device 1000 so that a read operation is performed on a memory block of the physical block address (PBA) mapped to the logical block address (LBA) and found in the mapping table of the internal memory 1120 at step S84.

If it is determined at step S83 that there is a hash value corresponding to the logical address received from the host 200 ("Yes" at step S83), the hash controller 210a may transmit information about physical block address (PBA) corresponding to the hash value to the CPU 230, and the CPU 230 may control the memory device 1000 so that a read operation is performed on memory blocks of the physical block addresses at step S85. For example, the physical block addresses may be consecutively selected by the hash value, and the CPU 230 may transmit the consecutively selected physical block addresses to the memory device 1000. The memory device 1000 may perform a read operation on memory blocks corresponding to the received physical block addresses. That is, when the hash value is detected from hash table 210b, the step of searching the internal memory 1120 for information about physical block addresses mapped to respective logical block addresses provided from the host 2000 may be omitted.

When the data read from the memory device 1000 is transmitted at step S84 or S85, the memory controller 1200 may output the read data to the host 2000 at step S86.

Among the above-described steps S81 to S86, other embodiments of steps S82 and S83 are described below.

The CPU 230 may determine whether sequential data is to be read or whether non-sequential data is to be read in response to a read request received from the host 2000. If it is determined that non-sequential data is to be read, only the mapping table of the internal memory 1120 may be searched for a physical address (PBA) according to a logic block address (LBA) provided from the host 2000. Here, the CPU 230 does not search the hash table 210b. Therefore, step S83 may be omitted, and step S84 may be performed.

If it is determined that sequential data is to be read, the CPU 230 may simultaneously search the mapping table of the internal memory 1120 and the hash table 210b.

That is, the CPU 230 may select the table (i.e., the mapping table of the internal memory 1120 and the hash table 210b) to be searched in response to the read request at step S82. That is, step S83 may be omitted, and step S85 may be performed.

Figure 10:
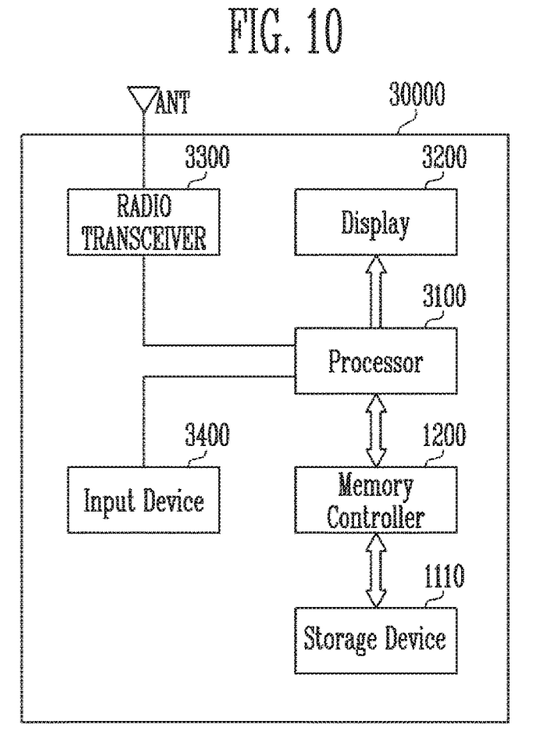
FIG. 10 is a diagram illustrating an embodiment of a memory system including a memory controller shown in FIG. 2.

FIG. 10 is a diagram illustrating an embodiment of a memory system including the memory controller of FIG. 2.

Referring to FIG. 10, a memory system 30000 may be implemented as a cellular phone, a smartphone, a tablet PC, a personal digital assistant (PDA) or a wireless communication device. The memory system 30000 may include a storage device 1110 and a memory controller 1200 that is capable of controlling the operation of the storage device 1110. The memory controller 1200 may control a data access operation for the storage device 1110, for example, a program operation, an erase operation or a read operation, under the control of a processor 3100. As described above, the memory controller 1200 may directly output read data received from the storage device 1110 to the processor 3100 without passing through a buffer memory during the read operation, thus shortening the time required for the read operation.

Data programmed to the storage device 1110 may be outputted via a display 3200 under the control of the memory controller 1200.

A radio transceiver 3300 may exchange radio signals through an antenna ANT. For example, the radio transceiver 3300 may change a radio signal received through the antenna ANT into a signal which may be processed in the processor 3100. Therefore, the processor 3100 may process a signal outputted from the radio transceiver 3300 and transmit the processed signal to the memory controller 1200 or the display 3200. The memory controller 1200 may transmit the signal processed by the processor 3100 to the storage device 1110. Furthermore, the radio transceiver 3300 may change a signal outputted from the processor 3100 into a radio signal, and output the changed radio signal to an external device through the antenna ANT. An input device 3400 may be used to input a control signal for controlling the operation of the processor 3100 or data to be processed by the processor 3100. The input device 3400 may be implemented as a pointing device such as a touch pad or a computer mouse, a keypad, a keyboard or a combination thereof. The processor 3100 may control the operation of the display 3200 such that data outputted from the memory controller 1200, data outputted from the radio transceiver 3300, or data outputted from the input device 3400 is outputted via the display 3200.

In an embodiment, the memory controller 1200 capable of controlling the operation of the storage device 1110 may be implemented as a part of the processor 3100 or a chip provided separately from the processor 3100.

Figure 11:
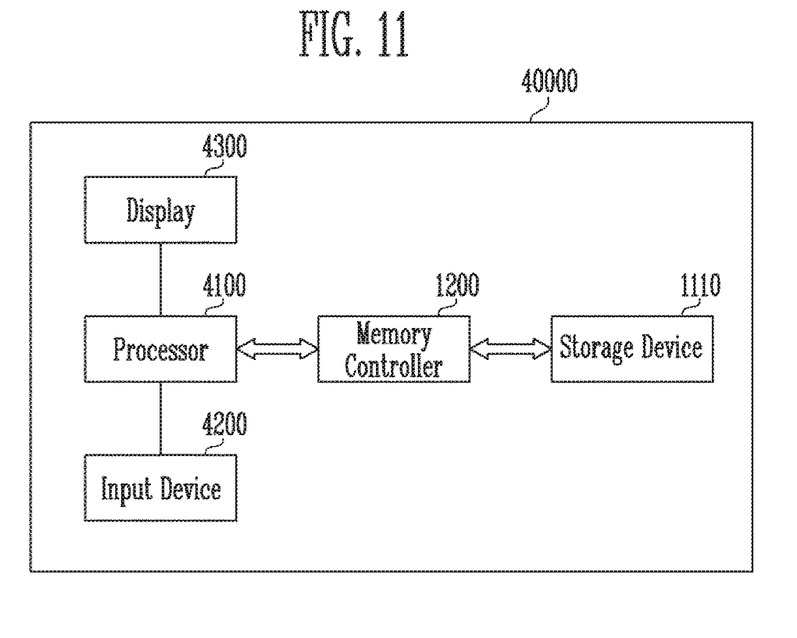
FIG. 11 is a diagram illustrating an embodiment of a memory system including the memory controller shown in FIG. 2.

FIG. 11 is a diagram illustrating an embodiment of a memory system including the memory controller of FIG. 2.

Referring to FIG. 11, a memory system 40000 may be embodied in a personal computer, a tablet PC, a net-book, an e-reader, a personal digital assistant (PDA), a portable multimedia player (PMP), an MP3 player, or an MP4 player.

The memory system 40000 may include a storage device 1110 and a memory controller 1200 that can control a data processing operation of the storage device 1110.

A processor 4100 may output data stored in the storage device 1110 via a display 4300 according to data inputted from an input device 4200. For example, the input device 4200 may be implemented as a pointing device such as a touch pad or a computer mouse, a keypad a keyboard or a combination thereof.

The processor 4100 may control the overall operation of the memory system 40000 and control the operation of the memory controller 1200. In an embodiment, the memory controller 1200 capable of controlling the operation of the storage device 1110 may be implemented as a part of the processor 4100 or a chip provided separately from the processor 4100.

In particular, the memory controller 1200 may directly output read data to the processor 4100 by omitting the operation of storing the read data in a buffer memory during a read operation, thus shortening the time required for the read operation.

Figure 12:
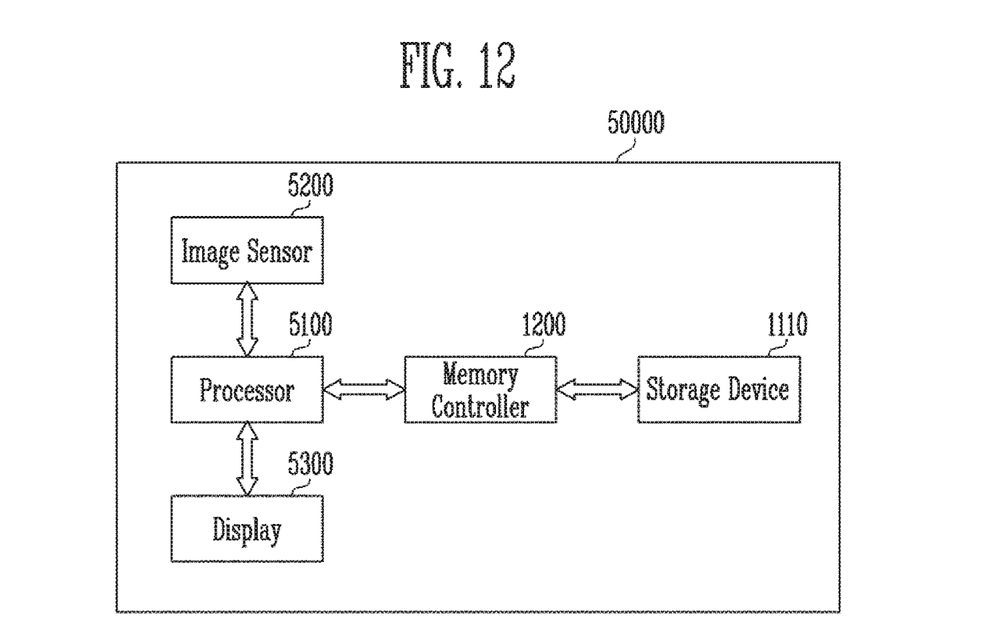
FIG. 12 is a diagram illustrating an embodiment of a memory system including the memory controller shown in FIG. 2.

FIG. 12 is a diagram illustrating an embodiment of a memory system including the memory controller of FIG. 2.

Referring to FIG. 12, a memory system 50000 may be embodied in an image processing device, e.g., a digital camera, a mobile phone provided with a digital camera, a smartphone provided with a digital camera, or a tablet PC provided with a digital camera.

The memory system 50000 may include a storage device 1110 and a memory controller 1200 that is capable of controlling a data processing operation of the storage device 1110, e.g., a program operation, an erase operation or a read operation.

An image sensor 5200 of the memory system 50000 may convert an optical image into digital signals. The converted digital signals may be transmitted to a processor 5100 or the memory controller 1200. Under the control of the processor 5100, the converted digital signals may be outputted via a display 5300 or stored in the storage device 1110 through the memory controller 1200. Data stored in the storage device 1110 may be outputted via the display 5300 under the control of the processor 5100 or the memory controller 1200.

In an embodiment, the memory controller 1200 capable of controlling the operation of the storage device 1110 may be implemented as a part of the processor 5100, or a chip provided separately from the processor 5100.

In particular, the memory controller 1200 may directly output read data to the processor 5100 by omitting the operation of storing the read data in a buffer memory during a read operation, thus shortening the time required for the read operation.

Figure 13:
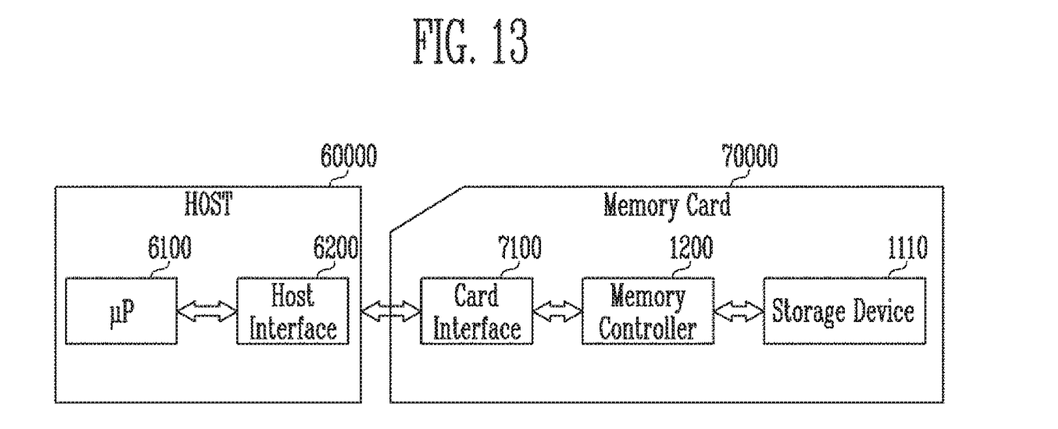
FIG. 13 is a diagram illustrating an embodiment of a memory system including the memory controller shown in FIG. 2.

FIG. 13 is a diagram illustrating an embodiment of a memory system including the memory controller of FIG. 2.

Referring to FIG. 13, a memory system 70000 may be embodied in a memory card or a smart card. The memory system 70000 may include a storage device 1110, a memory controller 1200, and a card interface 7100.

The memory controller 1200 may control data exchange between the storage device 1110 and the card interface 7100. In an embodiment, the card interface 7100 may be, but is not limited to, a secure digital (SD) card interface or a multimedia card (MMC) interface. In particular, the memory controller 1200 may directly output read data to the card interface 7100 by omitting the operation of storing the read data in a buffer memory during a read operation, thus shortening the time required for the read operation.

The card interface 7100 may interface data exchange between a host 60000 and the memory controller 1200 according to a protocol of the host 60000. In an embodiment, the card interface 7100 may support a universal serial bus (USB) protocol and an inter-chip (IC)-USB protocol. Here, the card interface may refer to hardware capable of supporting a protocol which is used by the host 60000, software installed in the hardware, or a signal transmission method.

When the memory system 70000 is coupled to a host interface 6200 of the host 60000, such as a PC, a tablet PC, a digital camera, a digital audio player, a mobile phone, console video game hardware or a digital set-top box, the host interface 6200 may perform data communication with the storage device 1110 through the card interface 7100 and the memory controller 1200 under the control of a microprocessor (μP) 6100.

The present disclosure may supplement insufficiency of the capacity of an internal memory in which address mapping information is stored, and may shorten the time required for the read operation of a memory system.

While the exemplary embodiments of the present disclosure have been disclosed for illustrative purposes, those skilled in the art will appreciate that various modifications, additions and substitutions are possible. Therefore, the scope of the present disclosure must be defined by the appended claims and equivalents of the claims rather than by the description preceding them.

What is claimed is:

1. A memory system, comprising:
a memory device including a first memory area in which sequential data is written, and a second memory area in which non-sequential data is written;
a hash controller configured to generate, in response to a write request for the sequential data, a hash value corresponding to the first memory area, and store the hash value in a hash table included therein, the hash table including physical block addresses corresponding to the hash value; and
a controller configured to:
in response to a read request, determine whether data to be read is sequential data or non-sequential data by searching the hash table for a hash value corresponding to the read request; and
when the hash value corresponding to the read request exists, control the memory device to perform a read operation according to the physical block addresses corresponding to the searched hash value.

2. The memory system according to claim 1, wherein the hash controller generates the hash value from logical block addresses corresponding to the first memory area.

3. The memory system according to claim 1,
wherein the hash table outputs the hash value mapped to an entry and transmits the hash value to the hash controller during the read operation, and
wherein the entry is a mapping entry between logical block addresses and the physical block addresses of the first memory area.

4. The memory system according to claim 1, wherein:
addresses of memory blocks included in the memory device are divided into entries, and
the entries are designated to be divided depending on respective capacities of the memory blocks.

5. The memory system according to claim 1, further comprising an internal memory including a logical-physical address mapping table in which mapping information between logical block addresses and the physical block addresses is stored.

6. The memory system according to claim 5, wherein the controller is configured to simultaneously search the hash table, in which the hash value is stored, and the internal memory or search only the internal memory, in response to the read request.

7. The memory system according to claim 6, wherein the controller is configured to:
compare an entry found in the internal memory with information stored in the hash table,
when a hash value corresponding to the entry is not present in the hash table, read data from the memory device in response to physical block addresses corresponding to logical block addresses included in the entry, and
when the hash value corresponding to the entry is present in the hash table, read the data from the memory device based on the hash value.

8. The memory system according to claim 6, wherein the controller is configured to simultaneously search the hash table and the internal memory when a sequential read request is received.

9. The memory system according to claim 1, wherein the first memory area and the second memory area are divided zones.

10. A method of operating a memory system, comprising:
generating a hash value in response to a write request for sequential data, the hash value corresponding to a first memory area included in a memory device comprising the first memory area and a second memory area,
storing the hash value in a hash table included therein, the hash table including physical block addresses corresponding to the hash value;
in response to a read request, determining whether data to be read is sequential data or non-sequential data by searching the hash table for a hash value corresponding to the read request; and
when the hash value corresponding to the read request exists, controlling the memory device to perform a read operation according to the physical block addresses corresponding to the searched hash value,
wherein the sequential data is written on the first memory area included in the memory device, and non-sequential data is written on the second memory area included in the memory device.

11. The method according to claim 10,
wherein the hash value mapped to an entry is outputted, and
wherein the entry is a mapping entry between logical block addresses and the physical block addresses of the first memory area.

12. The method according to claim 10, wherein, during the read operation, the physical block addresses of the first memory area to which the sequential data is written are consecutively selected based on the hash value.

13. The method according to claim 12, wherein, during the read operation, when the hash value is detected, searching an internal memory for information about respective physical block addresses mapped to logical block addresses included in an entry is omitted.

14. The method according to claim 10, wherein the first memory area and the second memory area are divided zones.

15. A memory system, comprising:
a memory device including a first memory area in which sequential data is written, and a second memory area in which non-sequential data is written; and
a memory controller configured to generate a hash value corresponding to the first memory area when the memory device performs a sequential program operation, wherein the memory controller is configured to:
in response to a read request, determine whether data to be read is sequential data or non-sequential data by searching the hash table for a hash value corresponding to the read request, and
when the hash value corresponding to the read request exists, control the memory device to perform a read operation according to physical block addresses corresponding to the searched hash value.

16. The memory system according to claim 15, wherein the memory controller generates the hash value from logical block addresses corresponding to the first memory area.

17. The memory system according to claim 15,
wherein the hash value mapped to an entry is outputted during the read operation, and
wherein the entry is a mapping entry between the logical block addresses and the physical block addresses of the first memory area.

18. The memory system according to claim 15, further comprising an internal memory including a logical-physical address mapping table in which mapping information between the logical block addresses and the physical block addresses is stored.

19. The memory system according to claim 18, wherein the controller is configured to simultaneously search hash table, in which the hash value is stored, and the internal memory or search only the internal memory, in response to the read request.

20. The memory system according to claim 15, wherein the first memory area and the second memory area are divided zones.

* * * * *